(12) United States Patent
Takahashi

(10) Patent No.: US 12,424,925 B2
(45) Date of Patent: Sep. 23, 2025

(54) FILTER FOR POWER CONVERSION DEVICE WITH PARALLEL POWER MODULES

(71) Applicant: Mitsubishi Electric Corporation, Tokyo (JP)

(72) Inventor: Hajime Takahashi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 473 days.

(21) Appl. No.: 17/957,371

(22) Filed: Sep. 30, 2022

(65) Prior Publication Data

US 2023/0208278 A1 Jun. 29, 2023

(30) Foreign Application Priority Data

Dec. 24, 2021 (JP) .................................. 2021-210181

(51) Int. Cl.
*H02M 1/088* (2006.01)
*H02M 3/335* (2006.01)
*H03K 17/16* (2006.01)
*H03K 17/687* (2006.01)

(52) U.S. Cl.
CPC ....... *H02M 1/088* (2013.01); *H02M 3/33569* (2013.01); *H03K 17/16* (2013.01); *H03K 17/687* (2013.01)

(58) Field of Classification Search
CPC ........ H02M 3/073; H02M 3/10; H02M 3/135; H02M 3/137; H02M 3/28; H02M 3/315; H02M 3/3155; H02M 3/325; H02M 3/335; H02M 7/10; H02M 7/515; H02M 7/521; H02M 7/53; H02M 7/537; H02M 7/5383; H02M 7/538466; H02M 7/53862; H02M 7/5387; H02M 7/53871; H02M 7/53875;
(Continued)

(56) References Cited

U.S. PATENT DOCUMENTS 7,259,623 B2 * 8/2007 Coleman ............ H05K 7/20927
330/251
9,735,676 B2 * 8/2017 Madsen .............. H02M 3/1588
(Continued)

FOREIGN PATENT DOCUMENTS

JP 2019-004558 A 1/2019
JP 2020-156304 A 9/2020
JP 2021-044996 A 3/2021

*Primary Examiner* — Sean Kayes
*Assistant Examiner* — Nusrat Quddus
(74) *Attorney, Agent, or Firm* — Sughrue Mion, PLLC

(57) ABSTRACT

A power conversion device includes: main circuits each having a plurality of power modules that are parallelly connected to each other; and driving circuits for driving the main circuits. The driving circuits are each provided with: at least one driver for generating control signals to be inputted to the respective module control terminals of the plurality of power modules; and a filter that is connected between the at least one driver and the module control terminals, the filter having, per each module pair formed of two power modules, an impedance characteristic with a peak shape showing an increased impedance in a predetermined specific frequency range. The filter has a coupling element per each module pair, the coupling element being connected between two module control terminals and including a capacitor.

20 Claims, 10 Drawing Sheets

(58) Field of Classification Search
CPC ........ H02M 7/757; H02M 7/79; H02M 3/337; H02M 3/338; H02M 3/3382; H02M 3/3384; H02M 7/538; H02M 7/53806; H02M 7/53832; H02M 7/53835; H02M 7/487; H02M 7/539; H02M 7/23; H02M 7/217; H02M 7/21; H02M 7/12; H02M 7/04; H02M 7/00; H02M 5/40; H02M 5/42; H02M 5/453; H02M 7/7575; H02M 5/458; H02M 5/45; H02M 5/4585; H02M 5/4505; H02M 5/451; H02M 5/452; H02M 5/447; H02M 5/456; H02M 1/12; H02M 1/4266; H02M 2001/123; H02H 7/261; H02H 7/268; H02J 3/36; H02J 3/01; H03K 3/012; H03K 3/013

See application file for complete search history.

(56) References Cited

U.S. PATENT DOCUMENTS

| | | | |
|---|---|---|---|
| 10,666,132 B2* | 5/2020 | Li | H02M 7/003 |
| 2006/0017388 A1* | 1/2006 | Stevenson | H01J 37/32174 |
| | | | 315/111.51 |
| 2011/0032734 A1* | 2/2011 | Melanson | H02M 7/53832 |
| | | | 363/37 |
| 2013/0265810 A1* | 10/2013 | Kawato | G05F 1/70 |
| | | | 363/131 |
| 2015/0303806 A1* | 10/2015 | Madsen | H02M 3/1563 |
| | | | 323/271 |
| 2017/0294840 A1* | 10/2017 | Madsen | H02M 1/08 |
| 2018/0138827 A1* | 5/2018 | Goto | H03K 17/168 |
| 2018/0369864 A1* | 12/2018 | Lei | B06B 1/045 |
| 2019/0097563 A1* | 3/2019 | Shimomugi | F25B 31/02 |
| 2020/0212836 A1* | 7/2020 | Feng | H02H 9/04 |

* cited by examiner

FILTER FOR POWER CONVERSION DEVICE WITH PARALLEL POWER MODULES

BACKGROUND OF THE INVENTION

1. Field of the Invention

The present application relates to a power conversion device.

2. Description of the Background Art

Power conversion devices recently used for electric powertrains in hybrid electric vehicles, electric vehicles, etc., each include parallelly-connected plural power modules having semiconductor switching elements such as IGBTs (Insulated Gate Bipolar Transistors), MOSFETs (Metal Oxide Semiconductor Field Effect Transistors) or the like. These power modules are operated so as to simultaneously cause switching operations, so that the power capacity of the power conversion device is increased (for example, Patent Document 1).

The power conversion device of Patent Document 1 is provided with a gate driving circuit for simultaneously driving parallelly-connected plural power modules (semiconductor modules) and a main circuit having the parallelly-connected plural power modules. According to a power conversion device which includes, like the power conversion device of Patent Document 1, parallelly-connected plural power modules, such cases may arise where a difference occurs between the switching-operation timings of the power modules because of: a characteristic difference between the power modules due to a characteristic difference between the semiconductor switching elements in these power modules; a fluctuation in inductance inside the main circuit; or a fluctuation in inductance between the main circuit and the gate driving circuit.

When there is a difference between switching-operation timings of the power modules, electric current unbalance occurs between these power modules, so that a current concentrates, for example, on the power module that was firstly turned ON. When a current concentrates on one of the power modules in this manner, there is a risk that a loss may increase to exceed an allowable limit for that power module. In addition to such a current-concentration problem, a resonance phenomenon may occur, for example, between parallelly-connected two power modules, as stated in Patent Document 2.

The resonance phenomenon between the power modules occurs due to internal inductance between the power modules that is induced by a voltage difference between these power modules, and parasitic capacitances of the semiconductor switching elements in these power modules. If a voltage amplitude due to resonance is superimposed on a surge peak voltage Vsp of a surge generated in a drain-to-source voltage Vds that is a voltage applied between a drain and a source in the power module, there is a risk that the drain-to-source voltage Vds may increase to exceed an allowable limit for that power module. In particular, this problem emerges significantly when, in order to reduce the loss of the power module, its switching operation is performed at a high speed di/dt.

For example, three methods are conceivable to deal with such a resonance phenomenon. The first method is to make the time difference in switching between the power modules smaller. For that method, it is required to make the fluctuation in element characteristic of the power module smaller and to uniformize the wiring lengths of the drain and the source. The second method is to set a low speed di/dt instead of the high speed di/dt and thus to employ a design that permits the occurrence of a large loss. In this case, since the loss of the power module will be large, it is required to use a large-sized semiconductor switching element or a high-performance element, for permitting that loss. The third method is to choose a large element having a high breakdown voltage and thus to permit the occurrence of the resonance phenomenon. In this case, however, such an element generally shows a large resistance when it is rendered conductive, and this results in a large loss.

Patent Document 1: Japanese Patent Application Laid-open No. 2020-156304 (FIG. 1, FIG. 4)

Patent Document 2: Japanese Patent Application Laid-open No. 2021-44996 (FIG. 3A, FIG. 3B)

According to Patent Document 1, at OFF operations of the parallelly-connected plural power modules, in order to eliminate the current unbalance, the power module whose gate threshold voltage is low, namely, which is slowly turned OFF, is connected to a low-impedance gate wiring line, while the power module whose gate threshold voltage is high, namely, which is quickly turned OFF, is connected to a high-impedance gate wiring line. Moreover, at ON operations of the parallelly-connected plural power modules, in order to eliminate the current unbalance, the power module whose gate threshold voltage is low, namely, which is quickly turned ON, is connected to a high-impedance gate wiring line, while the power module whose gate threshold voltage is high, namely, which is slowly turned OFF, is connected to a low-impedance gate wiring line. For establishing these connections, a gate wiring line for ON operation that is provided with a diode and a gate wiring line for OFF operation that is provided with a diode, are provided per each of the power modules. In order to switch between the gate wiring line for ON operation and the gate wiring line for OFF operation, the direction of the diode placed between the gate wiring line for ON operation and the power module is made different from the direction of the diode placed between the gate wiring line for OFF operation and the power module. In this manner, the power conversion device of Patent Document 1 can reduce the current unbalance between the parallelly-connected plural power modules.

When such a current-unbalance reduction method according to the power conversion device of Patent Document 1 is employed, it is possible to reduce a switching timing difference between the power modules, so that no resonance occurs between the power modules. However, this requires selecting the characteristics of the power modules so that switching timings of the power modules are matched with each other, and installing the respective gate wiring lines in the power conversion device in conformity with the characteristics of the power modules, so that the manufacturing steps of the power conversion device will be complicated. Further, in accordance with the complicated manufacturing steps of the power conversion device, a problem arises in that the yield may be deteriorated.

SUMMARY OF THE INVENTION

An object of the techniques disclosed in the present description is to reduce resonance between the parallelly-connected plural power modules if a switching timing difference occurs between these power modules.

A power conversion device disclosed as an example in the present description is a power conversion device for performing power conversion of input power by controlling turn-on periods of multiple main circuits each having a plurality of power modules, said power conversion device comprising said main circuits in which said plurality of power modules are parallelly connected to each other, and driving circuits for driving the main circuits. The plurality of power modules each include a semiconductor switching element, and each two of the plurality of power modules are regarded as a module pair. The driving circuits are each provided with: at least one driver for generating control signals to be inputted to respective module control terminals of the plurality of power modules; and a filter that is connected between said at least one driver and the module control terminals, said filter having, per each said module pair, an impedance characteristic with a peak shape showing an increased impedance in a predetermined specific frequency range. The filter has a coupling element per each said module pair, said coupling element being connected between two of the module control terminals and including a capacitor.

According to the power conversion device disclosed as an example in this description, the driving circuits for driving the main circuits are each provided with the filter having, per each said module pair, the coupling element connected between two of said module control terminals and including the capacitor. This makes it possible to reduce resonance between such a plurality of parallelly-connected power modules if a switching timing difference occurs between these power modules.

DETAILED DESCRIPTION OF THE EMBODIMENTS OF THE INVENTION

Embodiment 1

Figure 1:
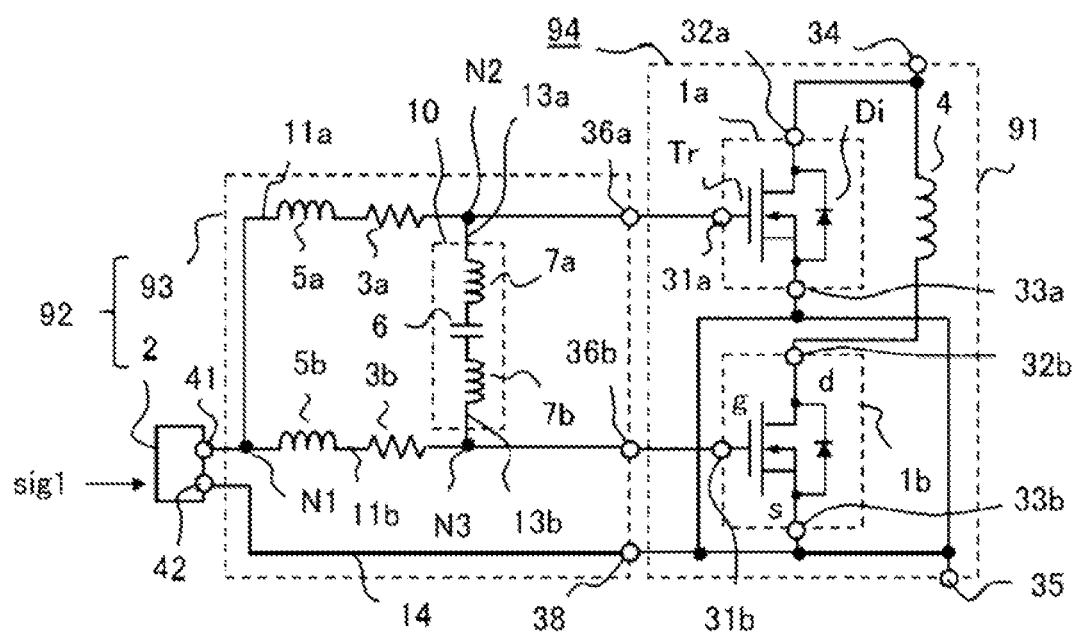
FIG. 1 is a diagram showing a configuration of a first fundamental circuit according to Embodiment 1.
Figure 2:
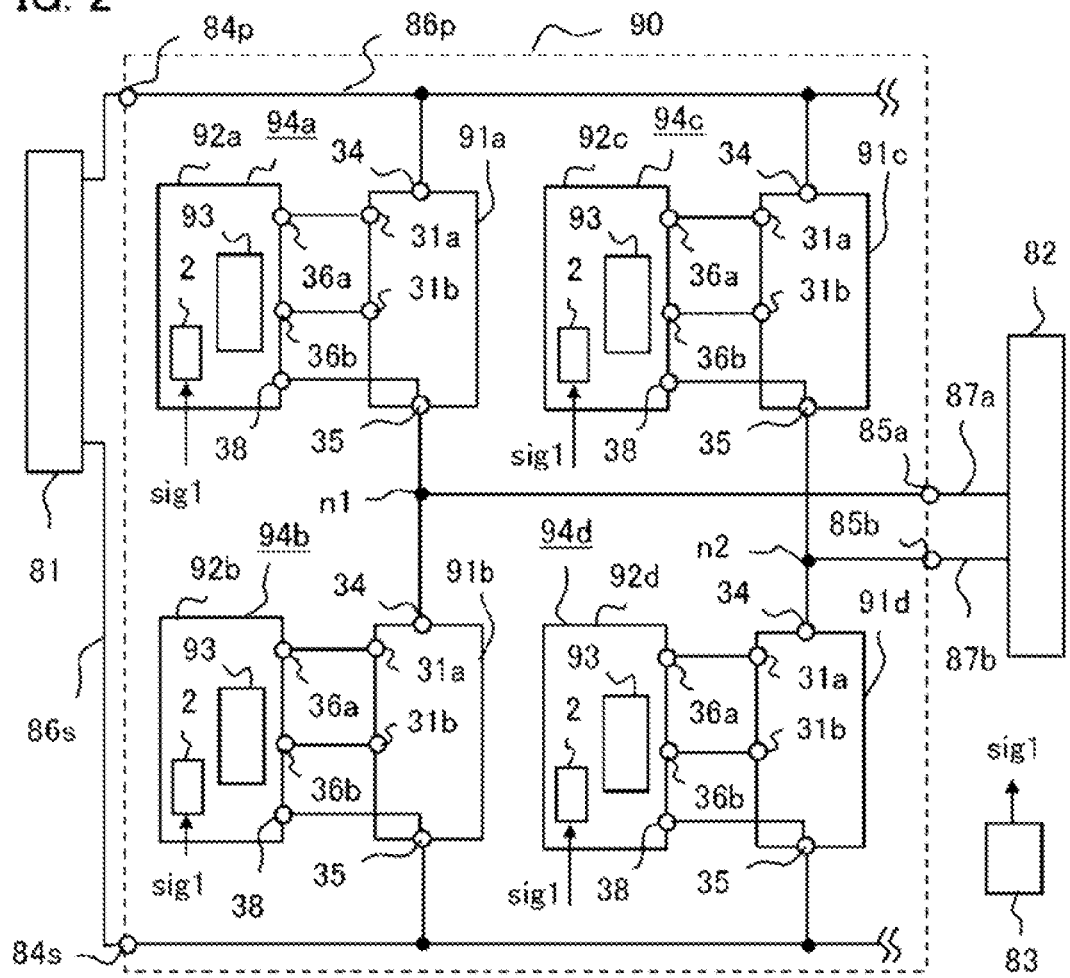
FIG. 2 is a diagram showing a configuration of a power conversion device according to Embodiment 1.
Figure 3:
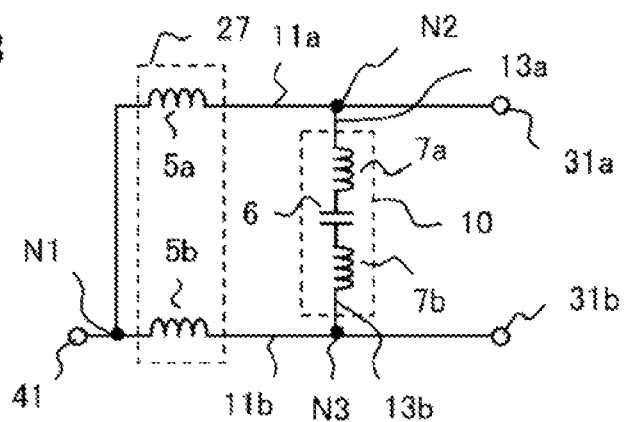
FIG. 3 is a diagram showing an equivalent circuit of a filter shown in FIG. 1.
Figure 4:
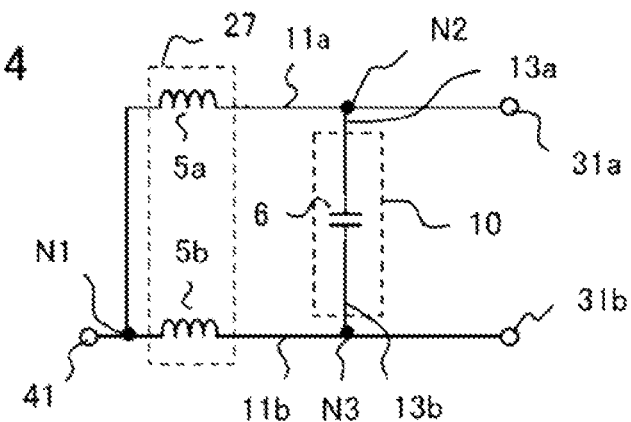
FIG. 4 is a diagram showing another equivalent circuit of the filter shown in FIG. 1.
Figure 5:
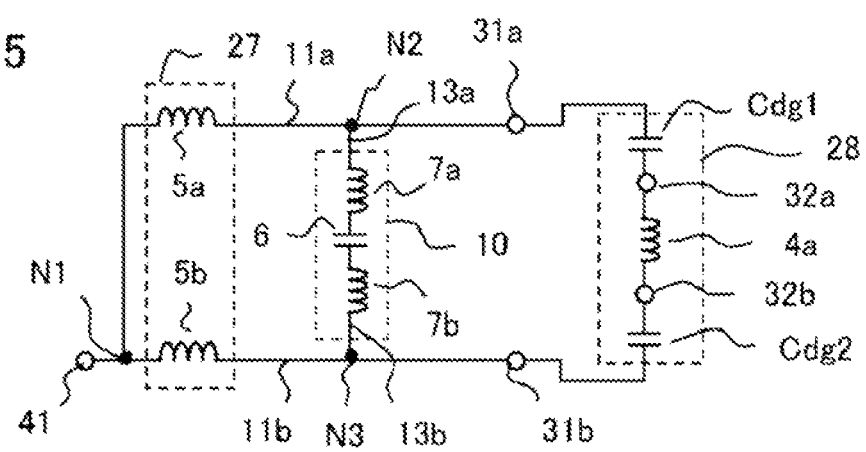
FIG. 5 is a diagram showing an equivalent circuit of the filter and a main circuit shown in FIG. 1.
Figure 6:
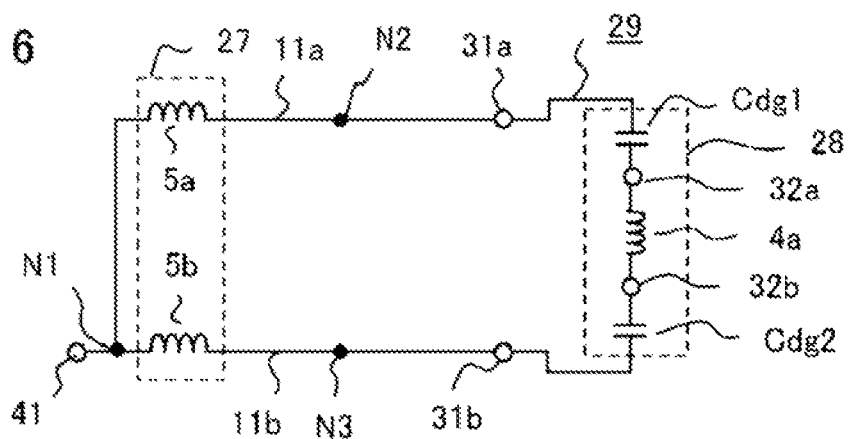
FIG. 6 is a diagram showing a resonance-path loop in FIG. 5.
Figure 7:
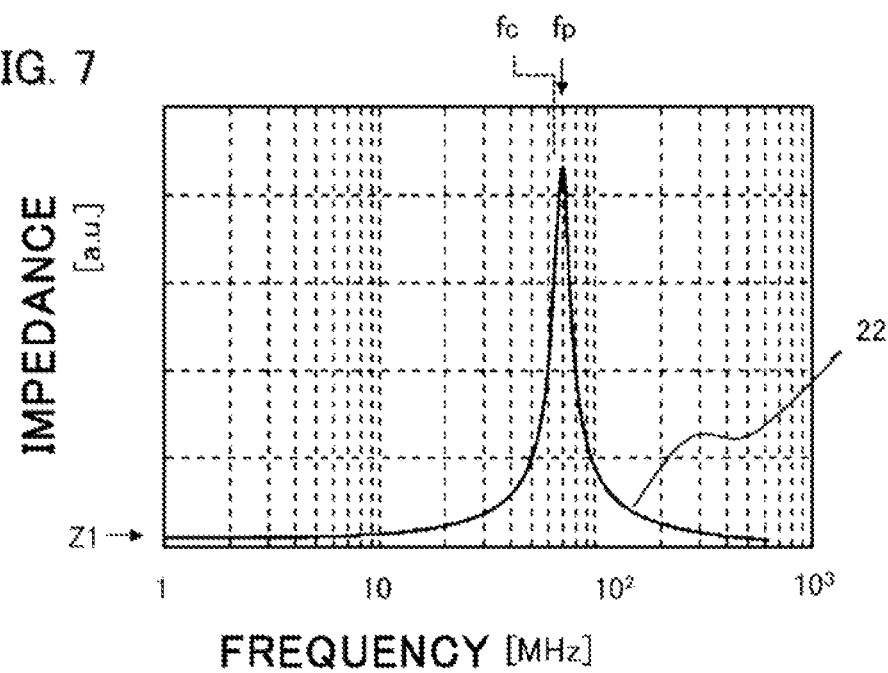
FIG. 7 is a diagram showing an impedance characteristic of the filter shown in FIG. 1.
Figure 8:
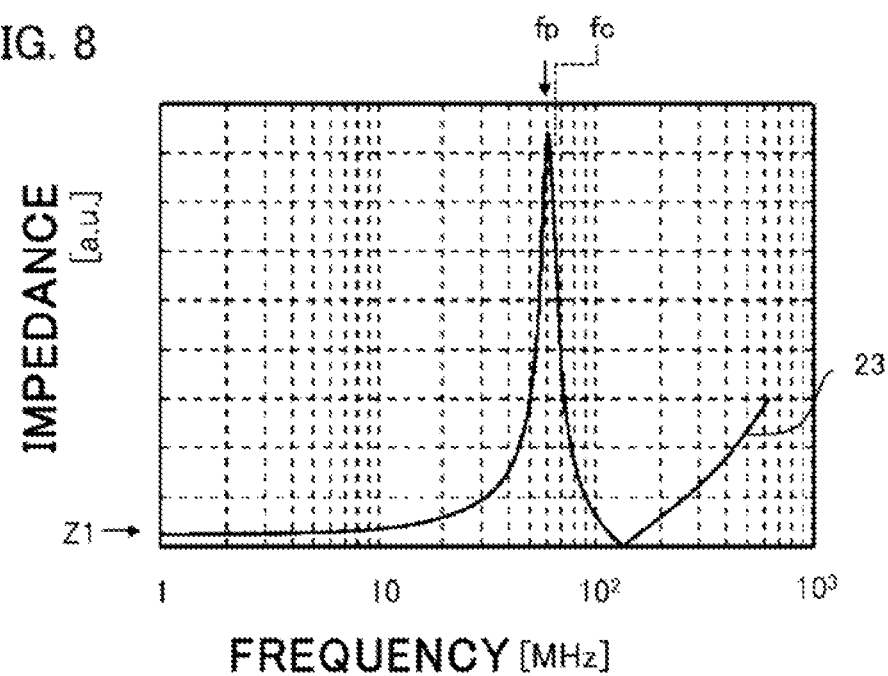
FIG. 8 is a diagram showing another impedance characteristic of the filter shown in FIG. 1.
Figure 9:
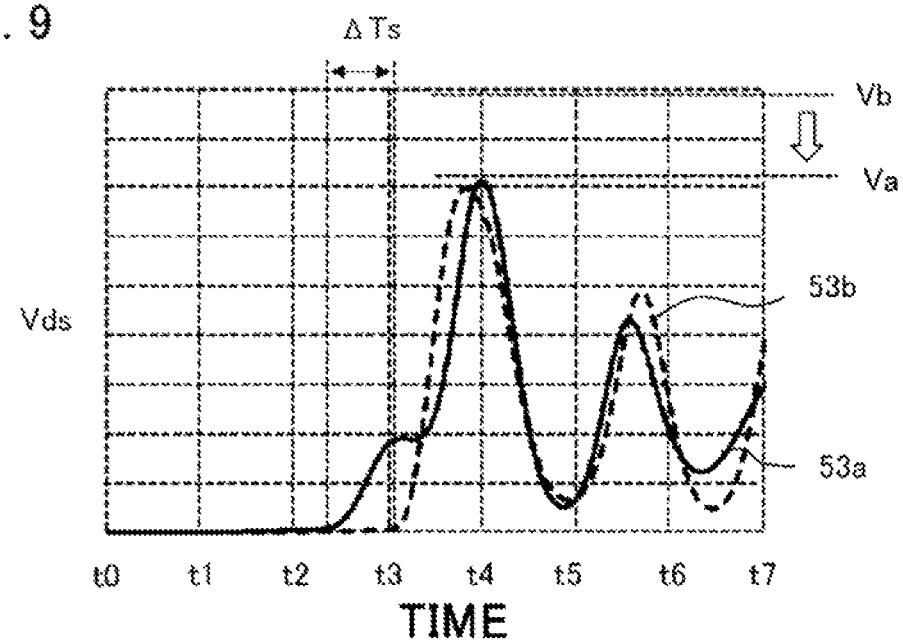
FIG. 9 is a diagram showing an exemplary output voltage of the main circuit according to Embodiment 1.
Figure 10:
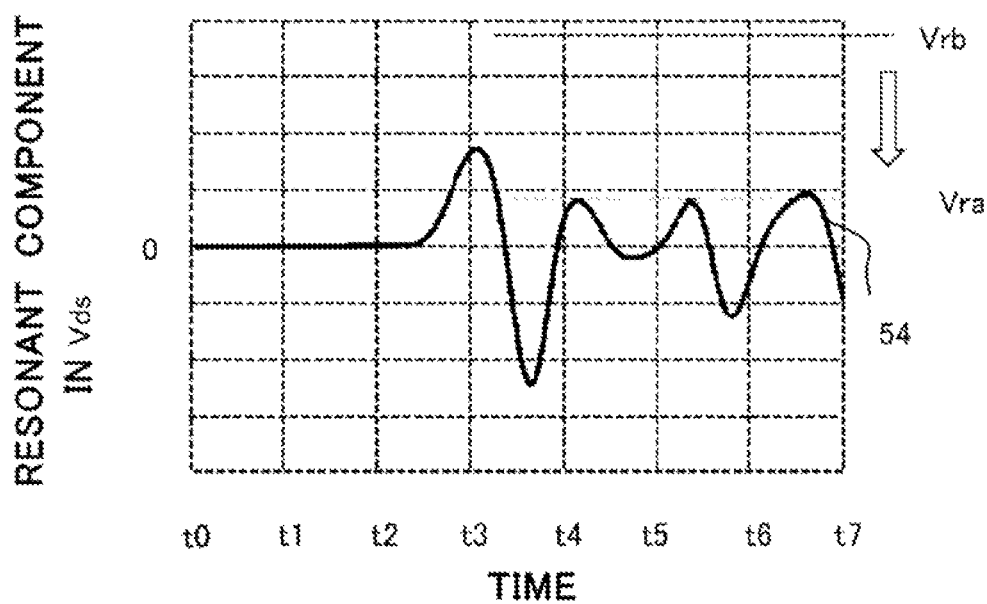
FIG. 10 is a diagram showing a resonant component according to FIG. 9.
Figure 11:
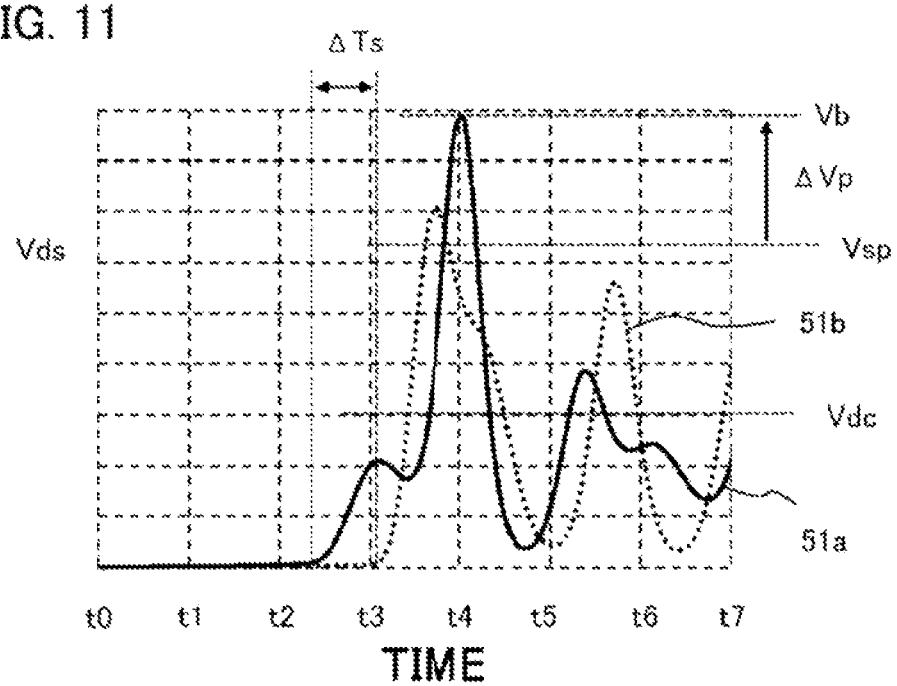
FIG. 11 is a diagram showing an exemplary output voltage of a main circuit according to a comparative example.
Figure 12:
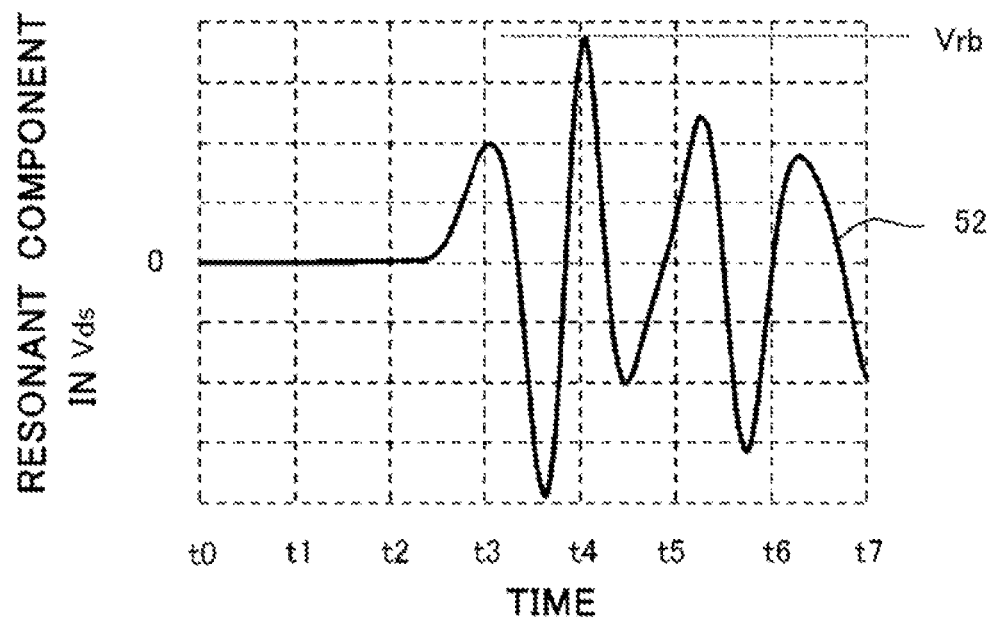
FIG. 12 is a diagram showing a resonant component according to FIG. 11.
Figure 13:
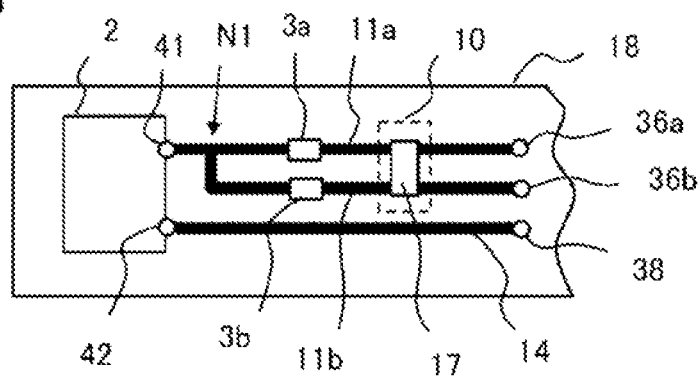
FIG. 13 is a diagram showing an exemplary layout of resistors and a coupling element shown in FIG. 1.
Figure 14:
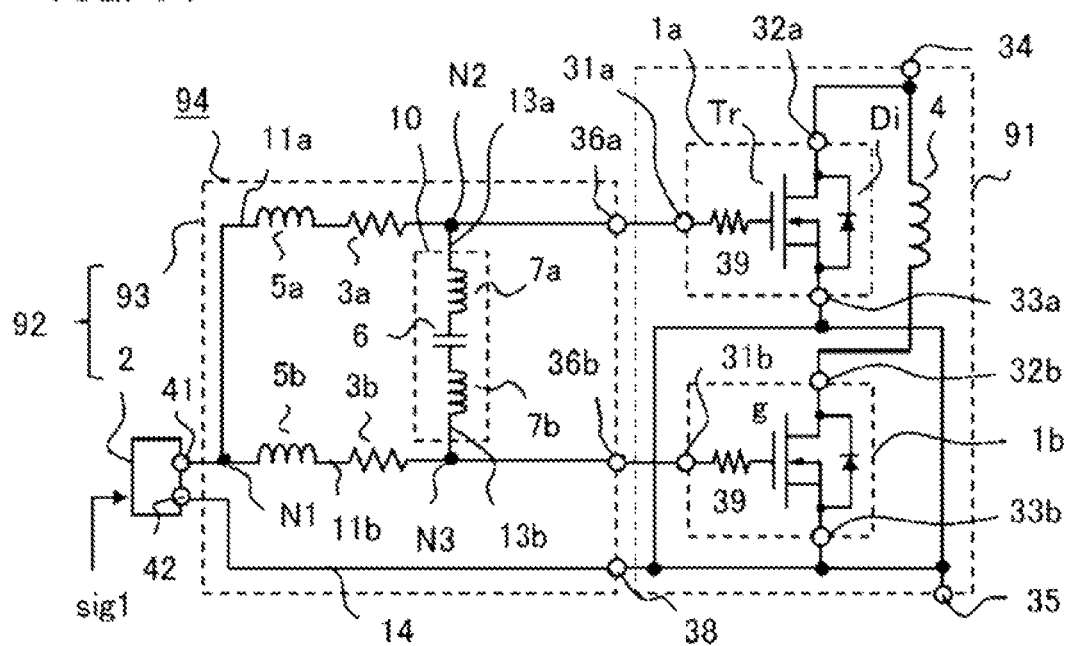
FIG. 14 is a diagram showing a configuration of a second fundamental circuit according to Embodiment 1.
Figure 15:
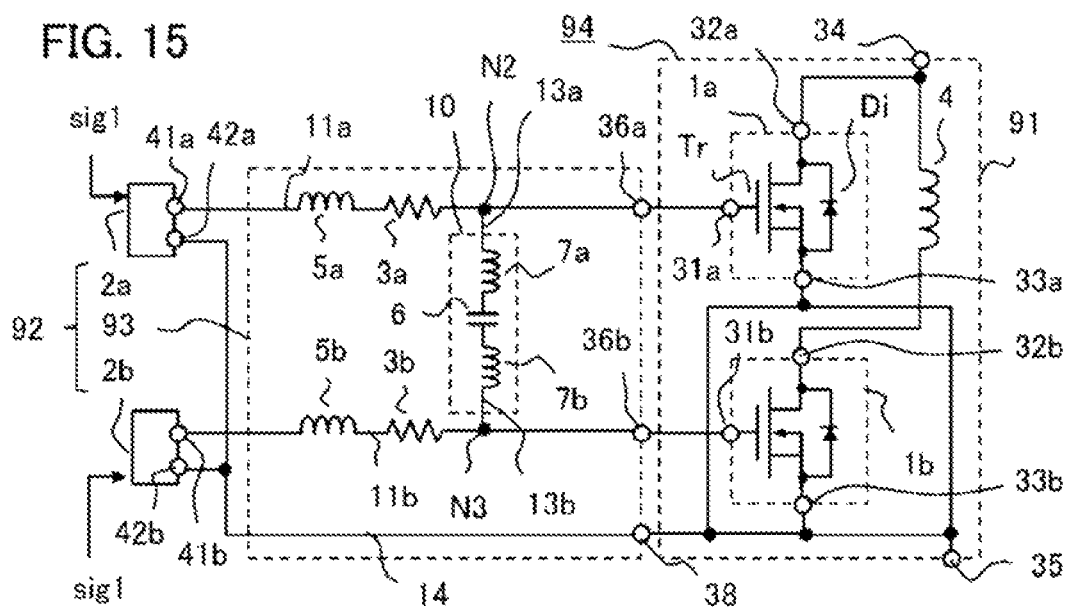
FIG. 15 is a diagram showing a configuration of a third fundamental circuit according to Embodiment 1.
Figure 16:
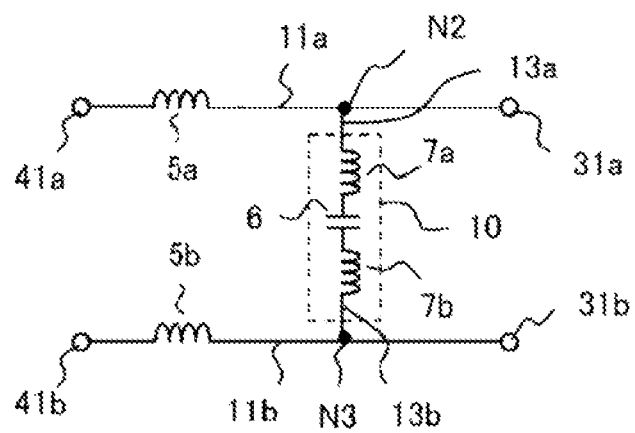
FIG. 16 is a diagram showing an equivalent circuit of a filter shown in FIG. 15.
Figure 17:
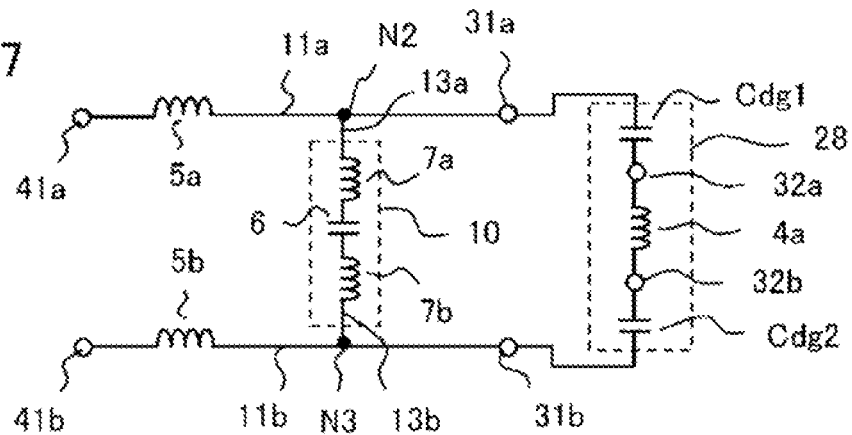
FIG. 17 is a diagram showing an equivalent circuit of the filter and a main circuit shown in FIG. 15.

FIG. 1 is a diagram showing a configuration of a first fundamental circuit according to Embodiment 1, and FIG. 2 is a diagram showing a configuration of a power conversion device according to Embodiment 1. FIG. 3 and FIG. 4 are diagrams each showing an equivalent circuit of a filter shown in FIG. 1. FIG. 5 is a diagram showing an equivalent circuit of the filter and a main circuit shown in FIG. 1, and FIG. 6 is a diagram showing a resonance-path loop in FIG. 5. FIG. 7 and FIG. 8 are diagrams each showing an impedance characteristic of the filter shown in FIG. 1. FIG. 9 is a diagram showing an exemplary output voltage of the main circuit according to Embodiment 1, and FIG. 10 is a diagram showing a resonant component according to FIG. 9. FIG. 11 is a diagram showing an exemplary output voltage of a main circuit according to a comparative example, and FIG. 12 is a diagram showing a resonant component according to FIG. 11. FIG. 13 is a diagram showing an exemplary layout of resistors and a coupling element shown in FIG. 1. FIG. 14 is a diagram showing a configuration of a second fundamental circuit according to Embodiment 1, and FIG. 15 is a diagram showing a configuration of a third fundamental circuit according to Embodiment 1. FIG. 16 is a diagram showing an equivalent circuit of a filter shown in FIG. 15, and FIG. 17 is a diagram showing an equivalent circuit of the filter and a main circuit shown in FIG. 15. In FIG. 2, an exemplary power conversion device 90 is shown, and in FIG. 1, a fundamental circuit 94 in the power conversion device 90 is shown. The power conversion device 90 performs power conversion of input power by controlling turn-on periods of multiple main circuits 91a, 91b, 91c, 91d each having a plurality of power modules 1a, 1b. The power conversion device 90 is, for example, a single-phase inverter including four fundamental circuits 94a, 94b, 94c, 94d. The fundamental circuits 94a, 94b, 94c, 94d are each configured as the fundamental circuit 94 shown in FIG. 1.

The power conversion device 90 shown in FIG. 2 coverts input power, namely, DC power inputted from a DC circuit 81 into AC power, and outputs the thus-converted AC power to an AC circuit 82. On the basis of driving-circuit control signals sig1 outputted from a control circuit 83, the power conversion device 90 controls the turn-on periods of the main circuits 91a, 91b, 91c, 91d in the respective fundamental circuits 94a, 94b, 94c, 94d. The fundamental circuit 94a includes the main circuit 91a and a driving circuit 92a for driving the main circuit 91a on the basis of the driving-circuit control signal sig1. Likewise, the fundamental circuits 94b, 94c, 94d include the main circuits 91b, 91c, 91d and driving circuits 92b, 92c, 92d for driving the fundamental circuits 91b, 91c, 91d on the basis of the driving-circuit control signals sig1, respectively. For the main circuits, reference numeral 91 is used collectively and the reference numerals 91a, 91b, 91c, 91d are used when they are to be described distinctively. For the driving circuits, reference numeral 92 is used collectively and reference numerals 92a, 92b, 92c, 92d are used when they are to be described distinctively. For the fundamental circuits, reference numeral 94 is used collectively and reference numerals 94a, 94b, 94c, 94d are used when they are to be described distinctively. Note that the driving-circuit control signals sig1 inputted to the respective driving circuits 92a, 92b, 92c, 92d are mutually independent signals matched with the operations of the power conversion device 90; however, in FIG. 2, their symbols are collectively written as "sig1".

In each of the main circuits 91, the plurality of power modules 1a, 1b are connected in parallel. The power modules 1a, 1b each include a transistor Tr that is a semiconductor switching element. The power modules 1a, 1b each include the transistor Tr as a MOSFET, and a diode Di that is connected in reverse parallel between a source s and a drain d of the transistor Tr. Gates g as the control terminals of two transistors Tr are connected to module control terminals 31a, 31b, respectively. The drains d of two transistors Tr are connected to module first power terminals 32a, 32b, respectively. The sources s of two transistors Tr are connected to module second power terminals 33a, 33b, respectively. The module first power terminals 32a, 32b are terminals through which power flows that is larger than that of control signals inputted to the module control terminals 31a, 31b, and the module second power terminals 33a, 33b are terminals at which respective potentials serving as voltage references for these control signals are generated.

The module first power terminal 32a of the power module 1a is connected to a main-circuit first power terminal 34 of the main circuit 91, and the module first power terminal 32b of the power module 1b is connected through an inductance 4 to the main-circuit first power terminal 34 of the main circuit 91. The inductance 4 is an inductance of a wiring line that makes connection between the module first power terminal 32a and the module first power terminal 32b. The module second power terminal 33a of the power module 1a and the module second power terminal 33b of the power module 1b are connected through a reference wiring line 14 to a main-circuit second power terminal 35 of the main circuit 91. The reference wiring line 14 is connected through a reference terminal 38 of the driving circuit 92 to a reference terminal 42 of a driver 2. The module control terminal 31a of the power module 1a is connected to a control terminal 36a of the driving circuit 92, and the module control terminal 31b of the power module 1b is connected to a control terminal 36b of the driving circuit 92. The power module 1a is turned ON or OFF according to the control signal outputted from the control terminal 36a of the driving circuit 92, so that the turn-on period of the power module 1a is controlled. The power module 1b is turned ON or OFF according to the control signal outputted from the control terminal 36b of the driving circuit 92, so that the turn-on period of the power module 1b is controlled.

The main circuits 91a, 91b, 91c, 91d form a full-bridge circuit. The main circuits 91a, 91c are disposed on the upper arm side and the main circuits 91b, 91d are disposed on the lower arm side. The main circuit on the upper arm side is connected in series to the main circuit on the lower arm side. Specifically, the main-circuit second power terminal 35 of the main circuit 91a and the main-circuit first power terminal 34 of the main circuit 91b are connected in series, to thereby form a series circuit. The main-circuit second power terminal 35 of the main circuit 91c and the main-circuit first power terminal 34 of the main circuit 91d are connected in series, to thereby form a series circuit. The main-circuit first power terminals 34 of the main circuits 91a, 91c are connected to a high-potential-side bus line 86p connected to a DC terminal 84p, and the main-circuit second power terminals 35 of the main circuits 91b, 91d are connected to a low-potential-side bus line 86s connected to a DC terminal 84s. The DC terminal 84p is connected to the high-potential side of the DC circuit 81 and the DC terminal 84s is connected to the low-potential side of the DC circuit 81. A connection point n1 between the main circuit 91a and the main circuit 91b is connected to an AC terminal 85a, and a connection point n2 between the main circuit 91c and the main circuit 91d is connected to an AC terminal 85b. AC power is outputted to the AC circuit 82 through an AC wiring line 87a connected to the AC terminal 85a and an AC wiring line 87b connected to the AC terminal 85b.

The driving circuits 92 are each provided with: the driver 2 for generating the control signals to be inputted the respective module control terminals 31a, 31b of the plurality of power modules 1a, 1b; and a filter 93 that is connected between the driver 2 and the multiple module control terminals 31a, 31b, said filter having, per each module pair, an impedance characteristic 22 or 23 with a peak shape showing an increased impedance in a predetermined specific frequency range. The module pair is a group of two power modules in the plurality of power modules. Note that in Embodiment 1, a case is shown where the number of module pairs is one. A case where the number of module pairs is three or more will be described in Embodiment 2.

The filter 93 includes control-signal wiring lines 11a, 11b for transferring the control signals from an output terminal 41 of the driver 2 to the respective module control terminals 31a, 31b of the power modules 1a, 1b, and a coupling element 10 including a capacitor 6 and connected between the module control terminals 31a, 31b. The control-signal wiring line 11a and the control-signal wiring line 11b are interconnected at a connection point N1 that is a driver-side connection point on their side where the output terminal 41 of the driver 2 is located. The coupling element 10 is connected to the control-signal wiring line 11a and the control-signal wiring line 11b at their respective connection points N2, N3 on their side where the module control terminals 31a, 31b are located. A wiring inductance 5a is present in the control-signal wiring line 11a and a wiring inductance 5b is present in the control-signal wiring line 11b. One end of the capacitor 6 is connected by way of a capacitor wiring line 13a to the control-signal wiring line 11a at the connection point N2, and the other end of the capacitor 6 is connected by way of a capacitor wiring line 13b to the control-signal wiring line 11b at the connection point N3. In general, a wiring inductance 7a is present in the capacitor wiring line 13a and a wiring inductance 7b is present in the capacitor wiring line 13b. In the coupling element 10, the inductance 7a, the capacitor 6 and the inductance 7b are connected in series. In FIG. 1, such a first fundamental circuit 94 is shown in which the number of drivers 2 is one, a resistor 3a is connected in the control-signal wiring line 11a, and a resistor 3b is connected in the control-signal wiring line 11b. By way of the control-signal wiring line 11a, the control signal outputted from the output terminal 41 of the driver 2 is inputted to the module control terminal 31a of the power module 1a through the control terminal 36a. Further, by way of the control-signal wiring line 11b, the control signal outputted from the output terminal 41 of the driver 2 is inputted to the module control terminal 31b of the power module 1b through the control terminal 36b.

In the first fundamental circuit 94 shown in FIG. 1, the plurality of parallelly-connected power modules 1a, 1b are not provided with their respective independent drivers 2 but are commonly provided with a single driver 2. Thus, a timing difference in control signal, namely, on or off signal, that may occur in the case where there are two independent drivers 2, between these drivers, will not occur, so that it is possible to reduce the switching timing difference. The first fundamental circuit 94 requires just one driver 2, and thus the number of its components can be reduced. This makes it possible to achieve cost reduction. Note that, as shown in FIG. 15, the plurality of parallelly-connected power modules 1a, 1b may be provided with their respective independent drivers 2a, 2b. If a switching timing difference occurs between the driver 2a and the driver 2b, because of the filter 93, it is possible to reduce resonance between these power modules 1a, 1b. The driving circuit 92 in a third fundamental circuit 94 shown in FIG. 15 is provided with two drivers 2a, 2b and the filter 93. By way of the control-signal wiring line 11a, the control signal outputted from an output terminal 41a of the driver 2a is inputted to the module control terminal 31a of the power module 1a through the control terminal 36a. By way of the control-signal wiring line 11b, the control signal outputted from an output terminal 41b of the driver 2b is inputted to the module control terminal 31b of the power module 1b through the control terminal 36b. The reference wiring line 14 is connected through the reference terminal 38 of the driving circuit 92 to a reference terminal 42a of the driver 2a and a reference terminal 42b of the driver 2b.

As represented by the equivalent circuit shown in FIG. 3, the filter 93 has an LC parallel circuit formed by a series inductance 27 and the coupling element 10, said series inductance having the inductance 5a and the inductance 5b that is connected in series thereto at the connection point N1. The filter 93 has the LC parallel circuit between the module control terminal 31a of the power module 1a and the module control terminal 31b of the power module 1b, and has an impedance characteristic 22 or 23 with a peak shape showing an increased impedance in a predetermined specific frequency range. The impedance characteristic 22 shown in FIG. 7 is a characteristic when the inductances 7a, 7b are each 0H, namely, corresponding to the equivalent circuit shown in FIG. 4. The impedance characteristic 23 shown in FIG. 8 is a characteristic when the inductances 7a, 7b are each larger than 0H, namely, corresponding to the equivalent circuit shown in FIG. 3. In the equivalent circuit shown in FIG. 3, the coupling element 10 is configured as an LC series circuit. In FIG. 7 and FIG. 8, the abscissa represents a frequency [MHz] and the ordinate represents an impedance [a.u. (arbitrary unit)].

As shown in FIG. 7, the impedance characteristic 22 is a characteristic of impedances having a peak at a specific frequency, namely, the impedance characteristic 22 is a characteristic with a peak shape showing an increased impedance at a peak frequency fp. The specific frequency range including the peak frequency fp is, for example, such a frequency range in which an impedance is ten times or more a minimum impedance Z1 in a range of frequencies on the side lower than the peak frequency fp. Voltage amplitude components of the control signals in the specific frequency range are attenuated at the time the control signals propagate between the power modules 1a, 1b through the control-signal wiring lines 11a, 11b.

How to set the peak frequency fp will be described. In FIG. 5, an equivalent circuit is shown which corresponds to a case where, due to a switching timing difference between the power modules 1a, 1b, a voltage difference emerges between inputs of the power modules 1a, 1b. In FIG. 5, a main-circuit impedance 28 that is an impedance of the main circuit 91 is established between the module control terminal 31a and the module control terminal 31b. The main-circuit impedance 28 is an impedance due to serial connection of: a first module capacitance Cdg1 between the module first power terminal 32a and the module control terminal 31a in one power module 1a; an inductance 4a between the module first power terminal 32a of one power module 1a and the module first power terminal 32b of the other power module 1b; and a second module capacitance Cdg2 between the module first power terminal 32b and the module control terminal 31b in the other power module 1b. In the impedance characteristic 22 or 23 of the LC parallel circuit formed in the filter 93 by the series inductance 27 and the coupling element 10, the peak frequency fp at which the impedance reaches a peak is set within ±25% of a resonant frequency fc of a loop path 29 that is formed by two control-signal wiring lines 11a, 11b having the series inductance 27, and the main-circuit impedance 28.

How the resonance between the plurality of parallelly-connected power modules can be reduced if a switching timing difference occurs between these power modules, will be described using FIG. 9 to FIG. 12. Shown in FIG. 9 is an exemplary output voltage of the main circuit 91 driven by the control signal outputted from the driving circuit 92 shown in FIG. 1. A driving circuit of a comparative example differs from the driving circuit 92 shown in FIG. 1 in that the coupling element 10 is not connected. A main circuit of the comparative example is the same as the main circuit 91. FIG. 9 and FIG. 11 show the output voltage of the main circuit 91 according to Embodiment 1 and an output voltage of a main circuit 91 according to the comparative example, respectively. FIG. 10 shows a resonant component in the output voltage of the main circuit 91 according to Embodiment 1, and FIG. 12 shows a resonant component in the output voltage of the main circuit 91 according to the comparative example. In FIG. 9 to FIG. 12, the abscissa represents time. In FIG. 9 and FIG. 11, the ordinate represents a drain-to-source voltage Vds as the output voltage. In FIG. 10 and FIG. 12, the ordinate represents a resonant component in the drain-to-source voltage Vds as the output voltage. Times t0, t1, t2, t3, t4, t5, t6, t7 written in FIG. 9 and FIG. 11 are respectively the same as times t0, t1, t2, t3, t4, t5, t6, t7 written in FIG. 10 and FIG. 12.

Description will firstly be made on the comparative example. When a difference in switching timing occurs between the power modules 1a, 1b, a resonance phenomenon as represented by FIG. 11 and FIG. 12 occurs between the power modules 1a, 1b. A voltage characteristic 51a is a voltage characteristic of the first power module 1a at the time it is turned OFF. A voltage characteristic 51b is a voltage characteristic of the second power module 1b at the time it is turned OFF in a delayed manner by a time difference ΔTs. "Vdc" denotes a bus line voltage of the power conversion device, "Vsp" denotes a surge peak voltage, and "ΔVp" denotes a superimposed peak voltage superimposed on the surge peak voltage Vsp. A voltage characteristic 52 represents resonant components in the voltage characteristic 51a. In FIG. 11, a maximum peak voltage Vb in the voltage characteristic 51a is shown. In FIG. 12, an oscillation voltage Vrb of the resonant component corresponding to the peak voltage Vb is shown. Note that, although the voltage characteristics 51a, 51b at the time the power modules are turned OFF are shown in FIG. 11, a resonance phenomenon also occurs at the time they are turned ON.

Description will then be made on the output voltage of the main circuit 91 and the resonant component therein, according to Embodiment 1. A voltage characteristic 53a is a voltage characteristic of the first power module 1a at the time it is turned OFF. A voltage characteristic 53b is a voltage characteristic of the second power module 1b at the time it is turned OFF in a delayed manner by the time difference ATs. A voltage characteristic 54 represents resonant components in the voltage characteristic 53a. According to the voltage characteristic 53a of Embodiment 1, the peak voltage Vb of the comparative example is reduced to a peak voltage Va. According to the voltage characteristic 54 of Embodiment 1, the oscillation voltage Vrb of the comparative example is reduced to an oscillation voltage Vra.

According to the power conversion device 90 of Embodiment 1, the filter 93 in the fundamental circuit 94 has the impedance characteristic 22 or 23 in which the peak frequency fp is set within ±25% of the resonant frequency fc of the loop path 29. Thus, it is possible to reduce resonance between the power modules 1a, 1b, to thereby suppress a resonant amplitude between the power modules 1a, 1b, from being superimposed as shown in FIG. 11, on a voltage surge between the module first power terminal 32a and the module second power terminal 33a in the power module 1a, or a voltage surge between the module first power terminal 32b and the module second power terminal 33b in the power module 1b. Therefore, according to the power conversion device 90 of Embodiment 1, it is possible to reduce the peak values of the respective voltages in the main circuit 91 between the module first power terminal 32a and the module second power terminal 33a and between the module first power terminal 32b and the module second power terminal 33b. Note that the drain-to-source voltage Vds is a voltage between the module first power terminal 32a(32b) and the module second power terminal 33a(33b), namely, an output voltage, in the case where the transistors Tr of the power modules 1a, 1b are MOSFETs.

According to the impedance characteristic 23 in the case where the inductances 7a, 7b are each larger than OH, the coupling element 10 is configured as an LC series circuit. Thus, as shown in FIG. 8, the impedance will increase in a range of frequencies on the side higher than the peak frequency fp, so that a low-impedance frequency range is formed and thus the coupling element has a bandpass characteristic.

When the inductances 7a, 7b of the respective capacitor wiring lines 13a, 13b are each larger than OH, the inductance value of the inductances 7a, 7b is designed to be one-half or less of that of the inductances 5a, 5b of the control-signal wiring lines 11a, 11b. Namely, the coupling element 10 has the inductances 7a, 7b between one control-signal wiring line 11a and one end of the capacitor 6 and between the other end of the capacitor 6 and the other control-signal wiring line 11b, respectively, and the value of the inductances 7a, 7b in the coupling element 10 is designed to be one-half or less of the value of the series inductance 27. This makes it possible for the filter 93 to have a high impedance at the resonant frequency fc between the power modules 1a, 1b, to thereby locate a bandpass-characteristic frequency range away from the resonant frequency fc by several tens of MHz or more. Thus, it is possible to shut off the resonant frequency fc between the power modules 1a, 1b to thereby reduce the resonant amplitude.

In order that the inductance value of the inductances 7a, 7b of the respective capacitor wiring lines 13a, 13b can be one-half or less of that of the inductances 5a, 5b of the control-signal wiring lines 11a, 11b, the coupling element 10 including the capacitor 6 may be mounted, as shown in FIG. 13, commonly on a board 18 on which resistors 3a, 3b are mounted. Further, the coupling element 10 may be a surface-mount type capacitor 17 with a breakdown voltage of several tens to several hundreds of volts (V). When the coupling element 10 is such a capacitor 17, the inductances 7a, 7b can be set to a much lower value or to OH. In FIG. 13, a case is shown where the driver 2, the coupling element 10 and the resistors 3a, 3b are mounted on the board 18. The resistors 3a, 3b are, for example, surface-mount type resistors, namely, chip resistors.

In the case where the resistors 3a, 3b are connected in the control-signal wiring lines 11a, 11b, the driving circuit 92 includes the resistors 3a, 3b for the respective power modules 1a, 1b, and outputs the control signals through the resistors 3a, 3b to the respective power modules 1a, 1b. In this case, if resonance occurs between the module control terminals 31a, 31b of the power modules 1a, 1b, because the resonance can be attenuated by the resistors 3a, 3b, it is possible to prevent an erroneous operation. Even if the filter 93 fails, the resistors 3a, 3b in the control-signal wiring lines 11a, 11b can retain such an erroneous-operation prevention effect.

According to the power conversion device 90 of Embodiment 1, the driving circuit 92 for driving the main circuit 91 is provided with the filter 93 having the coupling element 10 connected between two module control terminals 31a, 31b and including the capacitor 6. Thus, it is possible to reduce resonance between such a plurality of parallelly-connected power modules 1a, 1b if a switching timing difference occurs between these power modules 1a, 1b. The power conversion device 90 of Embodiment 1 does not require to choose a high-breakdown-voltage element that shows a large resistance when it is rendered conductive and thus causes a large loss, nor to set a low speed di/dt instead of a high speed di/dt and thus to employ a design that permits the occurrence of a large loss, for the purpose of dealing with the resonance phenomenon. Since the power conversion device 90 of Embodiment 1 does not require to use a large-sized semiconductor switching element whose cost is high or a high-performance element that is expensive, it is possible to avoid increased cost that is associated with the conventional way to deal with the resonance phenomenon.

It is noted that, as represented by a second fundamental circuit 94 shown in FIG. 14, the power conversion device 90 of Embodiment 1 may include, in addition to the resistors 3a, 3b, resistors 39 for the respective semiconductor switching elements used in the power modules 1a, 1b. The resistor 39 in the power module 1a is connected between the module control terminal 31a and the gate g of the transistor Tr. Likewise, the resistor 39 in the power module 1b is connected between the module control terminal 31b and the gate g of the transistor Tr. When the power modules 1a, 1b include the resistors 39 like this, the values of the resistors 3a, 3b may be set more flexibly. Thus, an impedance adjustable range of the filter 93 is enlarged, so that it becomes easy to design the filter to be matched to the level of the resonant amplitude between the power modules 1a, 1b.

Further, in the case where the power modules 1a, 1b include the resistors 39, the resistors 3a, 3b may be implemented by using wiring resistances only, not by mounting chip resistors or the like. Even in this case, since the power modules 1a, 1b include the resistors 39, their switching speeds are prevented from becoming too high, so that it is possible to prevent the power modules 1a, 1b from being broken down by an excessive voltage due to surge. In addition, since the number of mounting components to be mounted on the board 18 is decreased, it is possible to reduce the cost of the power conversion device 90. Further, since the number of mounting components to be mounted on the board 18 is decreased, flexibility for the layout of the components increases, so that the filter 93 can be placed at a more suitable location.

When the fundamental circuit 94 is the third fundamental circuit 94 shown in FIG. 15, the equivalent circuit of the filter 93 is given as FIG. 16, and the equivalent circuit of the filter 93 and the main circuit 91 corresponding to the case where a voltage difference emerges between the inputs is given as FIG. 17. The equivalent circuit of the filter 93 in the third fundamental circuit 94 and the equivalent circuit of the filter 93 and the main circuit 91 therein corresponding to the case where a voltage difference emerges between the inputs, differ from the equivalent circuits shown in FIG. 3 and FIG. 5, respectively, in that the inductance 5a and the inductance 5b are not directly connected to each other. However, because the drivers 2a, 2b are both driven by a common driving-circuit control signal sig1, it can be thought that the output terminal 41a and the output terminal 41b are virtually connected to each other, even though there is a little timing difference between the drivers 2a, 2b. Accordingly, the third fundamental circuit 94 also operates like the first fundamental circuit 94. Namely, the filter 93 in the fundamental circuit 94 operates like the filter 93 in the first fundamental circuit 94.

It is noted that the semiconductor switching elements of the power modules 1a, 1b are not limited to MOSFETs using silicon, and may be IGBTs. When the semiconductor switching elements of the power modules 1a, 1b are IGBTs, the respective voltages between the module first power terminals 32a, 32b and the module second power terminals 33a, 33b, namely, output voltages, are collector-to-emitter voltages. Further, the semiconductor switching elements may be MOSFETs or IGBTs using a wide-bandgap semiconductor material whose bandgap is wide. Such a power semiconductor switching element using a wide-bandgap semiconductor material has a high breakdown voltage and an excellent heat-dissipation capability, and allows high speed switching. Examples of the semiconductor switching element using a wide-bandgap semiconductor material include semi-conductor switching elements using, as base materials, a SiC (silicon carbide)-based material, a GaN (gallium nitride)-based material, a Diamond-based material, and the like. Since the semiconductor switching element using a wide-bandgap semiconductor material can increase the switching speed, it is possible to reduce the switching loss. The switching speed of the main circuit 91 including the power modules 1a, 1b that have the semiconductor switching elements using a wide-bandgap semiconductor material, namely, the total switching speed of the power module 1a and the power module 1b, can be set to 50 kA/µs or more as a maximum value assumable for various conditions including a condition in which the main circuit 91 is out of normal operation, for example, a condition in excessive-current protection range. In operations at a high speed di/dt as represented by 50 kA/µs or more, if the filter 93 is not included, a resonance phenomenon occurs significantly between the power modules 1a, 1b. However, the power conversion device 90 of Embodiment 1 includes the filters 93. Thus, if the switching speed of the main circuit 91 is 50 kA/µs or more and a switching timing difference occurs between such a plurality of parallelly-connected power modules 1a, 1b, it is possible to reduce resonance between these power modules 1a, 1b.

As described above, the power conversion device 90 of Embodiment 1 is a power conversion device for performing power conversion of input power by controlling the turn-on periods of the multiple main circuits 91 (91a, 91b, 91c, 91d) each having a plurality of power modules 1a, 1b, said power conversion device comprising said main circuits 91 in which said plurality of power modules 1a, 1b are parallelly connected to each other, and the driving circuits 92 for driving the main circuits 91. The plurality of power modules 1a, 1b each include a semiconductor switching element (transistor Tr). Each two power modules 1a, 1b in the plurality of power modules 1a, 1b are regarded as a module pair. The driving circuits 92 are each provided with: at least one driver 2 for generating the control signals to be inputted to the respective module control terminals 31a, 31b of the plurality of power modules 1a, 1b; and the filter 93 that is connected between said at least one driver 2 and the module control terminals 31a, 31b, said filter having, per each module pair, an impedance characteristic 22 or 23 with a peak shape showing an increased impedance in a predetermined specific frequency range. The filter 93 has the coupling element 10 per each module pair, said coupling element being connected between two module control terminals 31a, 31b and including the capacitor 6. According to the power conversion device 90 of Embodiment 1 with this configuration, the driving circuits 92 for driving the main circuits 91 is each provided with the filter 93 having, per each module pair, the coupling element 10 that is connected between two module control terminals 31a, 31b and includes the capacitor 6. Thus, it is possible to reduce resonance between such a plurality of parallelly-connected power modules 1a, 1b if a switching timing difference occurs between these power modules 1a, 1b.

Embodiment 2

Figure 18:
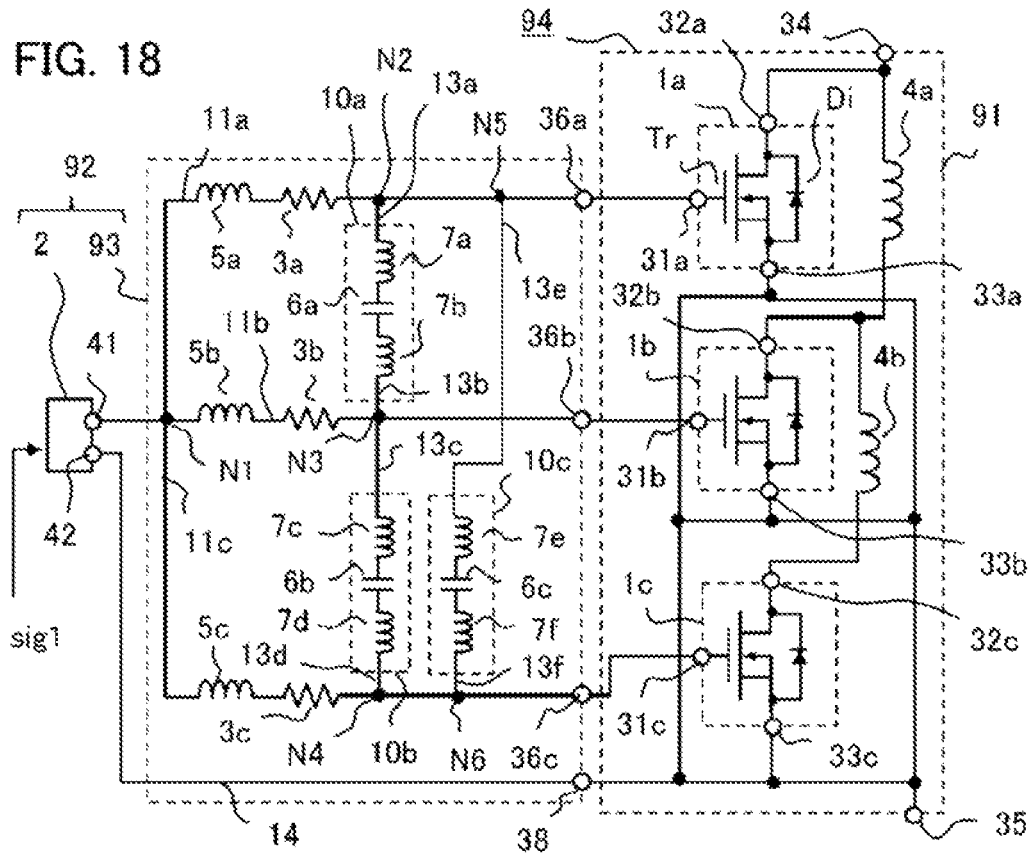
FIG. 18 is a diagram showing a configuration of a fundamental circuit according to Embodiment 2.
Figure 19:
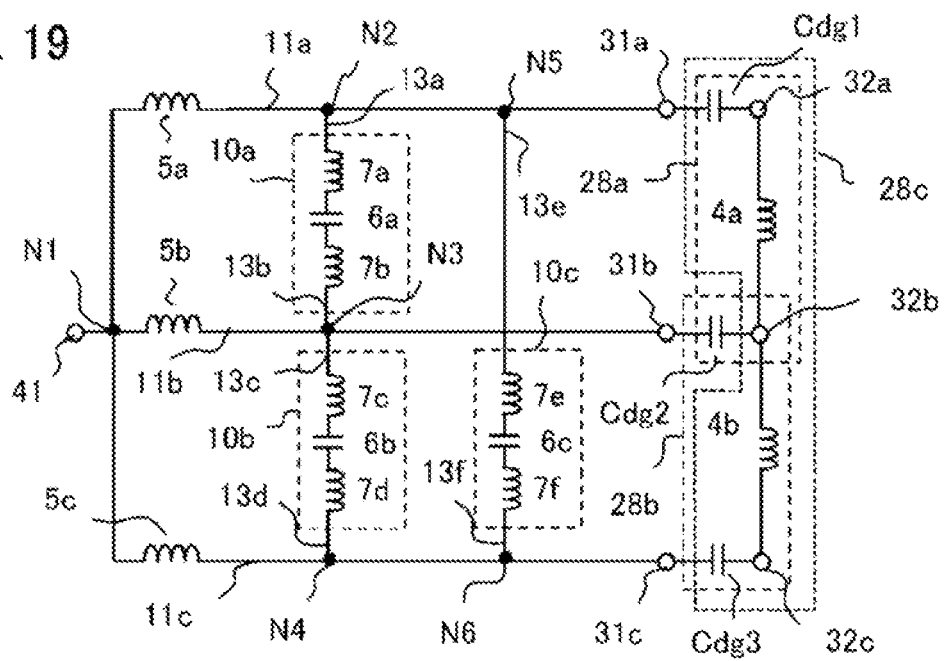
FIG. 19 is a diagram showing an equivalent circuit of a filter and a main circuit shown in FIG. 18.
Figure 20:
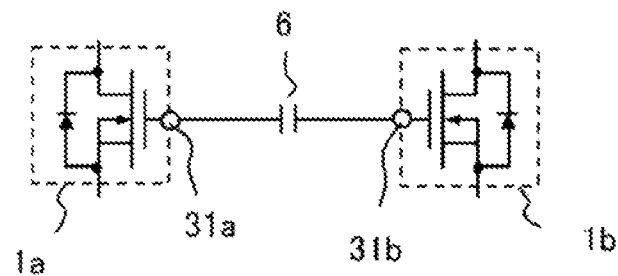
FIG. 20 is a diagram showing an exemplary connection of a capacitor, according to Embodiment 1.
Figure 21:
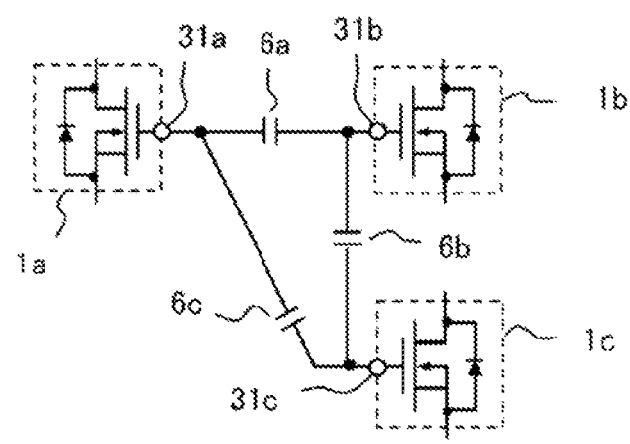
FIG. 21 is a diagram showing an exemplary connection of a capacitor, according to Embodiment 2.
Figure 22:
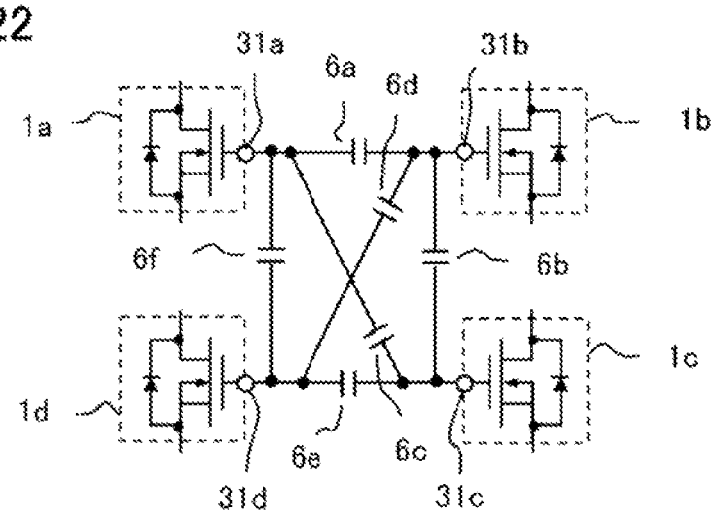
FIG. 22 is a diagram showing another exemplary connection of the capacitor, according to Embodiment 2.

FIG. 18 is a diagram showing a configuration of a fundamental circuit according to Embodiment 2, and FIG. 19 is a diagram showing an equivalent circuit of a filter and a main circuit shown in FIG. 18. FIG. 20 is a diagram showing an exemplary connection of a capacitor, according to Embodiment 1, FIG. 21 is a diagram showing an exemplary connection of a capacitor, according to Embodiment 2, and FIG. 22 is a diagram showing another exemplary connection of the capacitor, according to Embodiment 2. A power conversion device 90 of Embodiment 2 differs from the power conversion device 90 of Embodiment 1 in that main circuits 91 in its fundamental circuits 94 each have three or more power modules. Description will be made mainly on differences from Embodiment 1.

The fundamental circuit 94 shown in FIG. 18 is an example that includes the main circuit 91 having three power modules 1a, 1b, 1c. In the case of FIG. 18, the number of module pairs is three. The first module pair is a pair of the power module 1a and the power module 1b. The second module pair is a pair of the power module 1b and the power module 1c, and the third module pair is a pair of the power module 1a and the power module 1c. The filter 93 has, per each module pair, an impedance characteristic 22 or 23, with a peak shape showing an increased impedance in a predetermined specific frequency range.

In the main circuit 91, the plurality of power modules 1a, 1b, 1c are connected in parallel. Gates g as the control terminals of three transistors Tr are connected to module control terminals 31a, 31b, 31c, respectively. Drains d of three transistors Tr are connected to module first power terminals 32a, 32b, 32c, respectively. Sources s of three transistors Tr are connected to module second power terminals 33a, 33b, 33c, respectively. The module first power terminals 32a, 32b, 32c are terminals through which power flows that is larger than that of control signals inputted to the module control terminals 31a, 31b, 31c, and the module second power terminals 33a, 33b, 33c are terminals at which respective potentials serving as voltage references for these control signals are generated.

The module first power terminal 32a of the power module 1a is connected to a main-circuit first power terminal 34 of the main circuit 91, and the module first power terminal 32b of the power module 1b is connected through an inductance 4a to the main-circuit first power terminal 34 of the main circuit 91. The module first power terminal 32c of the power module 1c is connected through inductances 4a, 4b to the main-circuit first power terminal 34 of the main circuit 91. The inductance 4a is an inductance of a wiring line that makes connection between the module first power terminal 32a and the module first power terminal 32b. The inductance 4b is an inductance of a wiring line that makes connection between the module first power terminal 32b and the module first power terminal 32c. The module second power terminal 33a of the power module 1a, the module second power terminal 33b of the power module 1b and the module second power terminal 33c of the power module 1c are connected through a reference wiring line 14 to a main-circuit second power terminal 35 of the main circuit 91. The reference wiring line 14 is connected through a reference terminal 38 of the driving circuit 92 to a reference terminal 42 of the driver 2. The module control terminal 31a of the power module 1a is connected to a control terminal 36a of the driving circuit 92, and the module control terminal 31b of the power module 1b is connected to a control terminal 36b of the driving circuit 92. The module control terminal 31c of the power module 1c is connected to a control terminal 36c of the driving circuit 92. The power module 1a is turned ON or OFF according to the control signal outputted from the control terminal 36a of the driving circuit 92, so that the turn-on period of the power module 1a is controlled. The power module 1b is turned ON or OFF according to the control signal outputted from the control terminal 36b of the driving circuit 92, so that the turn-on period of the power module 1b is controlled. The power module 1c is turned ON or OFF according to the control signal outputted from the control terminal 36c of the driving circuit 92, so that the turn-on period of the power module 1c is controlled.

The driving circuit 92 is provided with: at least one driver 2 for generating the control signals to be inputted the respective module control terminals 31a, 31b, 31c of the plurality of power modules 1a, 1b, 1c; and the filter 93 that is connected between the driver 2 and the multiple module control terminals 31a, 31b, 31c, said filter having, per each module pair, an impedance characteristic 22 or 23 with a peak shape showing an increased impedance in a predetermined specific frequency range.

The filter 93 includes: control-signal wiring lines 11a, 11b, 11c for transferring the control signals from an output terminal 41 of the driver 2 to the respective module control terminals 31a, 31b, 31c of the power modules 1a, 1b, 1c; and coupling elements including capacitors and connected between the respective module control terminals 31a, 31b, 31c. Namely, there are provided: a coupling element 10a including a capacitor 6a and connected between the module control terminals 31a, 31b; a coupling element 10b including a capacitor 6b and connected between the module control terminals 31b, 31c; and a coupling element 10c including a capacitor 6c and connected between the module control terminals 31a, 31c. The control-signal wiring line 11a, the control-signal wiring line 11b and the control-signal wiring line 11c are interconnected at a connection point N1 that is a driver-side connection point on their side where the output terminal 41 of the driver 2 is located. The coupling element 10a is connected to the control-signal wiring line 11a and the control-signal wiring line 11b at their respective connection points N2, N3 on their side where the module control terminals 31a, 31b are located. The coupling element 10b is connected to the control-signal wiring line 11b and the control-signal wiring line 11c at their respective connection points N3, N4 on their side where the module control terminals 31b, 31c are located. The coupling element 10c is connected to the control-signal wiring line 11a and the control-signal wiring line 11c at their respective connection points N5, N6 on their side where the module control terminals 31a, 31c are located.

Wiring inductances 5a, 5b, 5c are present in the control-signal wiring lines 11a, 11b, 11c, respectively. One end of the capacitor 6a is connected by way of a capacitor wiring line 13a to the control-signal wiring line 11a at the connection point N2, and the other end of the capacitor 6a is connected by way of a capacitor wiring line 13b to the control-signal wiring line 11b at the connection point N3. One end of the capacitor 6b is connected by way of a capacitor wiring line 13c to the control-signal wiring line 11b at the connection point N3, and the other end of the capacitor 6b is connected by way of a capacitor wiring line 13d to the control-signal wiring line 11c at the connection point N4. One end of the capacitor 6c is connected by way of a capacitor wiring line 13e to the control-signal wiring line 11a at the connection point N5, and the other end of the capacitor 6c is connected by way of a capacitor wiring line 13f to the control-signal wiring line 11c at the connection point N6. In general, wiring inductances 7a, 7b, 7c, 7d, 7e, 7f are present in the capacitor wiring line 13a, 13b, 13c, 13d, 13e, 13f, respectively. In the coupling element 10a, the inductance 7a, the capacitor 6a and the inductance 7b are connected in series. In the coupling element 10b, the inductance 7c, the capacitor 6b and the inductance 7d are connected in series, and in the coupling element 10c, the inductance 7e, the capacitor 6c and the inductance 7f are connected in series. In FIG. 18, such a case is shown where the number of drivers 2 is one, and resistors 3a, 3b, 3c are connected in the control-signal wiring lines 11a, 11b, 11c, respectively.

The control signal outputted from the output terminal 41 of the driver 2 transfers along the control-signal wiring lines 11a, 11b, 11c. The control signal transferring along the control-signal wiring line 11a will be inputted through the control terminal 36a to the module control terminal 31a of the power module 1a. The control signal transferring along the control-signal wiring line 11b will be inputted through the control terminal 36b to the module control terminal 31b of the power module 1b, and the control signal transferring along the control-signal wiring line 11c will be inputted through the control terminal 36c to the module control terminal 31c of the power module 1c.

As represented by the equivalent circuit shown in FIG. 19 corresponding to the case where a voltage difference emerges between the inputs, the filter 93 has, per each module pair, an LC parallel circuit formed by a series inductance and a coupling element, said series inductance having inductances of two control-signal wiring lines, that are connected in series to each other. The LC parallel circuit in the filter 93 corresponding to the first module pair, is a circuit in which a series inductance and the coupling element 10*a* are connected in parallel to each other, said series inductance having the inductance 5*a* and the inductance 5*b* that is connected in series thereto at the connection point N1. The LC parallel circuit in the filter 93 corresponding to the second module pair, is a circuit in which a series inductance and the coupling element 10*b* are connected in parallel to each other, said series inductance having the inductance 5*b* and the inductance 5*c* that is connected in series thereto at the connection point N1. The LC parallel circuit in the filter 93 corresponding to the third module pair, is a circuit in which a series inductance and the coupling element 10*c* are connected in parallel to each other, said series inductance having the inductance 5*a* and the inductance 5*c* that is connected in series thereto at the connection point N1. The LC parallel circuits for the respective module pairs each have an impedance characteristic 22 or 23 with a peak shape showing an increased impedance in a predetermined specific frequency range, described in Embodiment 1.

The main-circuit impedance 28 described in Embodiment 1 is an impedance when, due to a switching timing difference between the power modules in one module pair, a voltage difference emerges between the inputs. A resonance phenomenon may occur in the loop path 29 (see, FIG. 6) of the module pair where a voltage difference emerges between the inputs. Accordingly, by means of the LC parallel circuit including the coupling element corresponding to that module pair, it is possible to reduce resonance between the power modules in that module pair. In FIG. 19, there are shown: a main-circuit impedance 28*a* when, due to a switching timing difference between the power modules 1*a*, 1*b*, a voltage difference emerges between the inputs of the power modules 1*a*, 1*b*; a main-circuit impedance 28*b* when, due to a switching timing difference between the power modules 1*b*, 1*c*, a voltage difference emerges between the inputs of the power modules 1*b*, 1*c*; and a main-circuit impedance 28*c* when, due to a switching timing difference between the power modules 1*a*, 1*c*, a voltage difference emerges between the inputs of the power modules 1*a*, 1*c*. When such voltage differences emerge between the respective inputs of the plurality of power modules, by means of the LC parallel circuits including the coupling elements, it is possible, for each of the corresponding module pairs, to reduce resonance between the power modules in that module pair. Since the main-circuit impedances 28*a*, 28*b*, 28*c* are each an impedance between one module control terminal and another module control terminal of each of the module pairs in the main circuit 91, it can be said to be a module pair impedance.

The main-circuit impedance 28*a* in the case where a voltage difference emerges between the inputs of the power modules in the first module pair, is an impedance due to serial connection of: a first module capacitance Cdg1 between the module first power terminal 32*a* and the module control terminal 31*a* in one power module 1*a*; an inductance 4*a* between the module first power terminal 32*a* of one power module 1*a* and the module first power terminal 32*b* of the other power module 1*b*; and a second module capacitance Cdg2 between the module first power terminal 32*b* and the module control terminal 31*b* in the other power module 1*b*. Likewise, the main-circuit impedance 28*b* in the case where a voltage difference emerges between the inputs of the power modules in the second module pair, is an impedance due to serial connection of: the second module capacitance Cdg2 between the module first power terminal 32*b* and the module control terminal 31*b* in one power module 1*b*; an inductance 4*b* between the module first power terminal 32*b* of one power module 1*b* and the module first power terminal 32*c* of the other power module 1*c*; and a third module capacitance Cdg3 between the module first power terminal 32*c* and the module control terminal 31*c* in the other power module 1*c*. The main-circuit impedance 28*c* in the case where a voltage difference emerges between the inputs of the power modules in the third module pair, is an impedance due to serial connection of: the first module capacitance Cdg1 between the module first power terminal 32*a* and the module control terminal 32*b* in one power module 1*a*; the inductance 4*a* and the inductance 4*b* between the module first power terminal 32*a* of one power module 1*a* and the module first power terminal 32*c* of the other power module 1*c*; and the third module capacitance Cdg3 between the module first power terminal 32*c* and the module control terminal 31*c* in the other power module 1*c*.

In the impedance characteristic 22 or 23 of each LC parallel circuit corresponding to each module pair in the filter 93, the peak frequency fp is set within ±25% of a resonant frequency fc of the loop path corresponding to said each module pair. The loop path of the first module pair is a path formed by two control-signal wiring lines 11*a*, 11*b* including a series inductance formed of an inductance 5*a* and an inductance 5*b* connected in series to each other, and the main-circuit impedance 28*a*. The loop path of the second module pair is a path formed by two control-signal wiring lines 11*b*, 11*c* including a series inductance formed of the inductance 5*b* and an inductance 5*c* connected in series to each other, and the main-circuit impedance 28*b*. The loop path of the third module pair is a path formed by two control-signal wiring lines 11*a*, 11*c* including a series inductance formed of the inductance 5*a* and the inductance 5*c* connected in series to each other, and the main-circuit impedance 28*c*.

According to the power conversion device 90 of Embodiment 2, the filter 93 in the fundamental circuit 94 has, per each module pair, an impedance characteristic 22 or 23 having a peak frequency fp that is set within ±25% of the resonant frequency fc of the corresponding loop path. Thus, it is possible to reduce resonance between two power modes in each module pair, to thereby suppress a resonant amplitude between two power modules from being superimposed on a voltage surge between the module first power terminal and the module second power terminal of the power module. Therefore, according to the power conversion device 90 of Embodiment 2, it is possible to reduce the peak values of the respective voltages in the main circuit 91 between the module first power terminal 32*a* 32*b*, 32*c* and the module second power terminal 33*a*, 33*b*, 33*c*.

According to the power conversion device 90 of Embodiment 2, even though the main circuit 91 in the fundamental circuit 94 has three or more parallelly-connected power modules, it is possible to reduce resonance that may occur between all of these power modules.

Although the fundamental circuit 94 in a case where the number of the parallelly-connected power modules is three, has been described using FIG. 18 and FIG. 19, the number of these power modules may be four or more. In that case, it suffices to configure the filter 93 to include coupling elements 10 whose number is the same as the number of the module pairs. In FIG. 20 to FIG. 22, exemplary connections between power modules and the capacitor/capacitors 6 in the coupling element/elements 10 are shown. In FIG. 20, an exemplary connection between two power modules 1*a*, 1*b* and the capacitor 6 in the coupling element 10, that corresponds to Embodiment 1, is shown. In the case of two power modules 1a, 1b, since the number of module pairs is one, the number of capacitors 6 is one.

In FIG. 21, an exemplary connection between three power modules 1a, 1b, 1c and the capacitors 6a, 6b, 6c in the coupling elements 10a, 10b, 10c, that corresponds to FIG. 18 according to Embodiment 2, is shown. In the case of three power modules 1a, 1b, 1c, since the number of module pairs is three, the number of capacitors 6 is three. In FIG. 22, an exemplary connection between four power modules 1a, 1b, 1c, 1d and capacitors 6a, 6b, 6c, 6d, 6e, 6f in six coupling elements is shown. In the case of four power modules 1a, 1b, 1c, 1d, since the number of module pairs is six, the number of capacitors 6 is six. With respect to the number of coupling elements 10 including capacitors 6 and a connection method thereof, it suffices to connect coupling elements 10 whose number is the same as the number of module pairs, to these respective module pairs, as shown in FIG. 20 to FIG. 22. More specifically, it suffices to make connections of the capacitors in a state like a complete graph corresponding to the number of the parallelly-connected power modules and using as vertexes, the module control terminals of these power modules. In FIG. 21, the module control terminals 31a, 31b, 31c of the power modules 1a, 1b, 1c are provided as the vertexes of a complete graph. In FIG. 22, the module control terminals 31a, 31b, 31c, 31d of the power modules 1a, 1b, 1c, 1d are provided as the vertexes of a complete graph.

As described above, the power conversion device 90 of Embodiment 2 is a power conversion device for performing power conversion of input power by controlling the turn-on periods of the multiple main circuits 91 (91a, 91b, 91c, 91d) each having a plurality of power modules 1a, 1b, 1c, said power conversion device comprising said main circuits 91 in which said plurality of power modules 1a, 1b, 1c are parallelly connected to each other, and the driving circuits 92 for driving the main circuits 91. The plurality of power modules 1a, 1b, 1c each include a semiconductor switching element (transistor Tr). Each two power modules 1a, 1b (or 1a, 1c, or 1b, 1c) in the plurality of power modules 1a, 1b, 1c are regarded as a module pair. The driving circuits 92 are each provided with: at least one driver 2 for generating the control signals to be inputted to the respective module control terminals 31a, 31b, 31c of the plurality of power modules 1a, 1b, 1c; and the filter 93 that is connected between said at least one driver 2 and the module control terminals 31a, 31b, 31c, said filter having, per each module pair, an impedance characteristic 22 or 23 with a peak shape showing an increased impedance in a predetermined specific frequency range. The filter 93 has the coupling elements 10a, 10b, 10c for the respective module pairs, said coupling elements each being connected between two of the module control terminals 31a, 31b, 31c and including the capacitor 6a, 6b, 6c. According to the power conversion device 90 of Embodiment 2 with this configuration, the driving circuits 92 for driving the main circuits 91 is each provided with the filter 93 having, for the respective module pairs, the coupling elements 10a, 10b, 10c that are each connected between two module control terminals 31a, 31b (or 31a, 31c, or 31b, 31c) and include their respective capacitors 6a, 6b, 6c. Thus, it is possible to reduce resonance between such a plurality of parallelly-connected power modules 1a, 1b, 1c if a switching timing difference occurs between these power modules 1a, 1b, 1c.

It is noted that, although a single-phase inverter for converting DC power into AC power has been described as an example of the power conversion device 90, the power conversion device is not limited thereto. The power conversion device 90 may be a converter for converting AC power into DC power, a DC-DC converter for converting DC power into DC power, or an AC-AC conversion device for converting AC power into AC power. Further, the power conversion device 90 is not limited to a single-phase device, and may be configured as a three-phase device. Further, when the driving circuit 92 and the main circuit 91 are mounted on a single board, the control terminals 36a, 36b, 36c and the reference terminal 38 of the driving circuit 92 may be eliminated. In this case, the control-signal wiring lines 11a, 11b, 11c are connected directly to the corresponding module control terminals 31a, 31b, 31c, and the reference wiring line 14 makes direct connection between the main circuit 91 and the reference terminal 42 of the driver 2.

In this application, a variety of exemplary embodiments and examples are described; however, every characteristic, configuration or function that is described in one or more embodiments, is not limited to being applied to a specific embodiment, and may be applied singularly or in any of various combinations thereof to another embodiment. Accordingly, an infinite number of modified examples that are not exemplified here are supposed within the technical scope disclosed in the present description. For example, such cases shall be included where at least one configuration element is modified; where any configuration element is added or omitted; and furthermore, where at least one configuration element is extracted and combined with a configuration element of another embodiment.

What is claimed is:

1. A power conversion device for performing power conversion of input power by controlling turn-on periods of multiple main circuits each having a plurality of power modules, said power conversion device comprising said main circuits in which said plurality of power modules are parallelly connected to each other, and driving circuits for driving the main circuits;
   wherein the plurality of power modules each include a semiconductor switching element, and each two of the plurality of power modules are regarded as a module pair;
   wherein the driving circuits are each provided with: at least one driver for generating control signals to be inputted to respective module control terminals of the plurality of power modules; and a filter that is connected between said at least one driver and the module control terminals of each module pair, said filter having, per each said module pair, an impedance characteristic with a peak shape showing an increased impedance in a predetermined specific frequency range; and
   wherein the filter has a coupling element per each said module pair, said coupling element being connected between two of the module control terminals and including a capacitor and the filter is not electrically coupled to a power output of the module pair to which the filter is connected.

2. The power conversion device of claim 1, wherein the driving circuits are each provided with a single driver as said at least one driver.

3. The power conversion device of claim 1, wherein the driving circuits are each provided with, as said at least one driver, drivers whose number is same as that of the plurality of power modules, and these power modules are each controlled by the control signal of its corresponding one of the drivers.

4. A power conversion device for performing power conversion of input power by controlling turn-on periods of multiple main circuits each having a plurality of power modules, said power conversion device comprising said main circuits in which said plurality of power modules are parallelly connected to each other, and driving circuits for driving the main circuits;
   wherein the plurality of power modules each include a semiconductor switching element, and each two of the plurality of power modules are regarded as a module pair;
   wherein the driving circuits are each provided with: at least one driver for generating control signals to be inputted to respective module control terminals of the plurality of power modules; and a filter that is connected between said at least one driver and the module control terminals, said filter having, per each said module pair, an impedance characteristic with a peak shape showing an increased impedance in a predetermined specific frequency range; and
   wherein the filter has a coupling element per each said module pair, said coupling element being connected between two of the module control terminals and including a capacitor,
   wherein the driving circuits are each provided with a single driver as said at least one driver and control-signal wiring lines for transferring the control signals from an output terminal of the driver to the respective module control terminals of the plurality of power modules;
   wherein, per each said module pair, the coupling element is connected between two of the control-signal wiring lines on their side where the module control terminals are located, and said two control-signal wiring lines are interconnected at a driver-side connection point on their side where the output terminal of the driver is located; and
   wherein a series inductance is connected in parallel to the coupling element, said series inductance having an inductance between a connection point at which the coupling element is connected to one of said two control-signal wiring lines and the driver-side connection point, and an inductance between another connection point at which the coupling element is connected to the other one of said two control-signal wiring lines and the driver-side connection point;
   whereby, per each said module pair, the filter has an LC parallel circuit formed by the series inductance and the coupling element.

5. The power conversion device of claim 4, wherein the power modules each have: the module control terminal; a module first power terminal through which power flows that is larger than that of the control signal; and a module second power terminal at which a potential serving as a voltage reference for the control signal is generated;
   wherein, assuming that an impedance in the main circuit between one of the module control terminals in the module pair and the other one of the module control terminals is a module pair impedance, the module pair impedance is an impedance established by a series connection of:
   a first module capacitance between the module first power terminal and the module control terminal in one of the power modules in the module pair; an inductance between the module first power terminal in said one of the power modules and the module first power terminal in the other one of the power modules in that module pair; and a second module capacitance between the module first power terminal and the module control terminal in said other one of the power modules; and
   wherein, per each said module pair, the filter has a peak frequency at which an impedance according to the impedance characteristic by the LC parallel circuit corresponding to that module pair reaches a peak, said peak frequency being set within ±25% of a resonant frequency of a loop path that is formed by said two control-signal wiring lines having the series inductance, and the module pair impedance.

6. The power conversion device of claim 4, wherein the coupling element has inductances between one of said two control-signal wiring lines and one end of the capacitor and between the other end of the capacitor and the other one of said two control-signal wiring lines; and
   wherein a value of the inductances of the coupling element is one-half or less of a value of the series inductance.

7. The power conversion device of claim 1, wherein the capacitor of the coupling element is a surface-mount type capacitor.

8. The power conversion device of claim 1, wherein the driving circuits each have resistors for their respective power modules, to thereby output the control signals through the resistors to the respective power modules.

9. The power conversion device of claim 8, wherein the resistors and the capacitor of the coupling element in the driving circuit are mounted on a single board.

10. The power conversion device of claim 1, wherein the power modules are each provided with a resistor between the module control terminal and a control terminal of the semiconductor switching element.

11. The power conversion device of claim 1, wherein the semiconductor switching element is a semiconductor switching element using a wide-bandgap semiconductor material.

12. The power conversion device of claim 1, wherein, in the main circuit, a maximum value of a switching speed achieved by the plurality of power modules is set to 50 kA/µs or more.

13. The power conversion device of claim 5, wherein the coupling element has inductances between one of said two control-signal wiring lines and one end of the capacitor and between the other end of the capacitor and the other one of said two control-signal wiring lines; and
   wherein a value of the inductances of the coupling element is one-half or less of a value of the series inductance.

14. The power conversion device of claim 2, wherein the driving circuits each have resistors for their respective power modules, to thereby output the control signals through the resistors to the respective power modules.

15. The power conversion device of claim 3, wherein the driving circuits each have resistors for their respective power modules, to thereby output the control signals through the resistors to the respective power modules.

16. The power conversion device of claim 4, wherein the driving circuits each have resistors for their respective power modules, to thereby output the control signals through the resistors to the respective power modules.

17. The power conversion device of claim 5, herein the driving circuits each have resistors for their respective power modules, to thereby output the control signals through the resistors to the respective power modules.

18. The power conversion device of claim 6, wherein the driving circuits each have resistors for their respective power modules, to thereby output the control signals through the resistors to the respective power modules.

19. The power conversion device of claim 7, wherein the driving circuits each have resistors for their respective power modules, to thereby output the control signals through the resistors to the respective power modules.

20. The power conversion device of claim 2, wherein the power modules are each provided with a resistor between the module control terminal and a control terminal of the semiconductor switching element.

* * * * *